(12) United States Patent
Bergmann et al.

(10) Patent No.: US 7,389,903 B2
(45) Date of Patent: Jun. 24, 2008

(54) DEVICE AND METHOD FOR SOLDERING CONTACTS ON SEMICONDUCTOR CHIPS

(75) Inventors: Robert Bergmann, Regensberg (DE); Holger Hubner, Baldham (DE)

(73) Assignee: Infineon Technologies AG (DE)

( * ) Notice: Subject to any disclaimer, the term of this patent is extended or adjusted under 35 U.S.C. 154(b) by 523 days.

(21) Appl. No.: 10/812,830

(22) Filed: Mar. 29, 2004

(65) Prior Publication Data

US 2004/0240865 A1    Dec. 2, 2004

Related U.S. Application Data

(63) Continuation of application No. PCT/DE02/03506, filed on Sep. 19, 2002.

(30) Foreign Application Priority Data

Sep. 27, 2001    (DE) ................................ 101 47 789

(51) Int. Cl.
*B23K 1/00* (2006.01)
(52) U.S. Cl. .......................... 228/33; 228/245; 228/256; 392/418
(58) Field of Classification Search ................... 228/33, 228/42, 261, 245, 256; 392/418, 407
See application file for complete search history.

(56) References Cited

U.S. PATENT DOCUMENTS

| | | | |
|---|---|---|---|
| 3,864,728 A | | 2/1975 | Peltz et al. |
| 4,099,660 A | * | 7/1978 | Schultz et al. ................ 228/13 |
| 4,320,865 A | | 3/1982 | Batinovich |
| 5,302,801 A | | 4/1994 | Kanda et al. |
| 5,305,944 A | * | 4/1994 | Yoshida et al. ......... 228/180.22 |
| 5,364,011 A | * | 11/1994 | Baker et al. ............ 228/180.21 |
| 5,430,567 A | * | 7/1995 | Shaw et al. ................. 359/107 |
| 5,668,058 A | * | 9/1997 | Tanioka et al. .............. 438/108 |
| 5,846,476 A | * | 12/1998 | Hwang et al. ............... 264/493 |
| 5,878,942 A | * | 3/1999 | Kodama et al. ......... 228/180.22 |
| 5,897,341 A | | 4/1999 | Love et al. |
| 5,984,165 A | * | 11/1999 | Inoue et al. ............ 228/180.22 |
| 6,135,344 A | * | 10/2000 | Sakuyama et al. ....... 228/234.1 |
| 6,265,244 B1 | | 7/2001 | Hayashi et al. |
| 6,288,376 B1 | * | 9/2001 | Tsumura ..................... 219/635 |
| 6,333,253 B1 | * | 12/2001 | Brownfield et al. ......... 438/612 |
| 6,334,567 B1 | * | 1/2002 | Xie et al. ................. 228/110.1 |
| 6,384,366 B1 | * | 5/2002 | Wong ...................... 219/85.12 |

(Continued)

FOREIGN PATENT DOCUMENTS

DE    195 04 967 A1    8/1996

(Continued)

*Primary Examiner*—Kevin P. Kerns
*Assistant Examiner*—Michael Aboagye
(74) *Attorney, Agent, or Firm*—Dickstein, Shapiro, LLP.

(57) ABSTRACT

A device for soldering contacts on semiconductor chips. A chip is held on a chip mount by a chuck and is heated from a side facing away from the wafer by means of a radiation source, so that a solder applied to a side facing the wafer is melted. A flushing device, having a plate with a window, a gas channel, and a gas outlet opening for a forming gas, is arranged at the window, is fitted parallel to the wafer. The chip is moved vertically in relation to the wafer, pressed onto the wafer through the window, and soldered on by means of isothermal solidification.

12 Claims, 1 Drawing Sheet

U.S. PATENT DOCUMENTS 6,401,317 B1 * 6/2002 Yamada .................... 29/33 M

FOREIGN PATENT DOCUMENTS

| | | | |
|---|---|---|---|
| DE | 197 47 846 A1 | 5/1999 |
| DE | 198 50 595 A1 | 7/2000 |
| DE | 199 07 276 A1 | 9/2000 |
| GB | 2 244 374 | * 11/1991 |
| GB | 2 244 374 A1 | 11/1991 |
| TW | 359881 | 6/1999 |

* cited by examiner

DEVICE AND METHOD FOR SOLDERING CONTACTS ON SEMICONDUCTOR CHIPS

CROSS-REFERENCE TO RELATED APPLICATION

This application is a continuation of International Patent Application Serial No. PCT/DE02/03506, filed Sep. 19, 2002, which published in German on Apr. 10, 2003 as WO 03/030246, and is incorporated herein by reference in its entirety.

FIELD OF THE INVENTION

The present invention relates to a device for soldering contacts especially on vertically integrated semiconductor chips.

BACKGROUND OF THE INVENTION

In the three-dimensional integration of semiconductor chips, a number of levels of thinned chips are adjusted on one another and electrically connected. Component placement takes place in an automatic placement machine in which the individually separated chips are placed in an adjusted manner onto a wafer. The surfaces of the wafer and of the chips have surfaces that are structured with contact areas in mirror-image patterns in relation to one another, so that the contacts belonging to one another can be applied with great accuracy such that they fit on one another. The surface of the wafer consists for example of bare copper, that of the chips for example of tin or a low-melting tin alloy. In the case of this process, the problem arises that the bare metal surfaces, especially the copper surface, oxidize because of the high process temperatures. An oxidation layer, however, prevents reliable contacting.

Soldering methods for the soft-soldering of copper surfaces with lead-tin-based solders are known and work very reliably. In these cases, the thicknesses of the solder layers lie in the range of 100 µm. During the heating operation, the surfaces are flushed with forming gas, the reactive fraction of which prevents oxidation. A soldering technique which is known by the terms "isothermal solidification" or SOLID uses extremely thin solder layers of less than 5 µm in thickness. In the case of this soldering method, complete alloying of the solder metal with the adjoining metal surfaces occurs during the soldering operation, accompanied by the formation of intermetallic phases, whereby the melting point rises and the solder melt isothermally solidifies. While thin oxide layers may break up when a thicker solder layer is used, so that adequately good contacting can be established, even a thin oxide layer is enough to completely prevent wetting of the metal surface with a very thin layer of the solder material.

An especially important requirement in the case of the SOLID soldering method is that the metal surfaces which are being soldered to one another remain completely free of oxide. Therefore, it is necessary to achieve a situation in which as little atmospheric oxygen as possible gets into the atmosphere of forming gas surrounding the wafer during the heating operation. For this purpose, the forming gas must enclose the chip region to be heated as impenetrably as possible. However, this cannot take place completely, since both surfaces must be freely accessible during the adjustment.

GB 2244374 A describes a device for soldering contacts on vertically integrated semiconductor chips in which a clamping device, a flushing device, a chip mount and a heater are provided. DE 198 50 595 A1 and DE 195 04 967 A1 disclose methods of producing chip-carrier connections in which the solder points are heated from the rear side of the chip.

DE 197 47 846 A1 disclosed a method of contacting components, in particular for connecting a semiconductor chip to a leadframe, in which isothermal solidification is used. A silicon chip can be connected to a silicon substrate in the way described. The connection of the contacts applied to the sub-elements takes place by means of an intermediate layer, which is melted by supplying vibrational energy, and the connection is established by isothermal solidification. Thermal support for this operation may be provided, since the reaction is expediently carried out at elevated temperature under inert gas.

SUMMARY OF THE INVENTION

An object of the invention is to specify a device and a method for soldering contacts on semiconductor chips with which extremely thin metal areas can be soldered to one another in air at approximately 300° C. without the occurrence of oxidation, which prevents a durable electrically conducting connection from being established, during the heating operation. In particular, it is also intended to prevent unprotected areas that are present alongside the metal areas to be soldered from oxidizing.

A device according to the invention is provided with a heater which is designed in such a way that a chip held on a chip mount above a clamping device (chuck) of an automatic placement machine can be heated from a side of the chip facing the chip mount at least to such a degree that a solder applied to the opposite side of the chip, facing the clamping device, is melted. There is also a flushing device, which has a plate with a window, a gas channel for forming gas and a gas outlet opening arranged at the window. This plate is fitted above the clamping device, aligned parallel to the transporting area intended for the wafer. The chip mount is vertically movable in relation to the transporting area of the clamping device, so that the chip can be brought as near as desired to a wafer arranged on the transporting area and, in particular, can be pressed onto the wafer with a pressing pressure which is provided or can be set.

This device also allows implementation of a method according to the invention, in which a solder is applied to the contact of the chip, the contacts are flushed with a forming gas, the solder is melted, in that the chip is heated from a side facing away from the contact, until the melted solder forms a layer of a thickness of less than 5 µm the contacts are pressed onto one another and the solder is cooled to such an extent that it undergoes an isothermal solidification.

BRIEF DESCRIPTION OF THE DRAWINGS

The description of a preferred exemplary embodiment of the device according to the invention, which also allows the method according to invention to be performed, follows on the basis of FIGS. 1 and 2.

DETAILED DESCRIPTION OF THE PREFERRED MODE OF THE INVENTION

Figure 1:
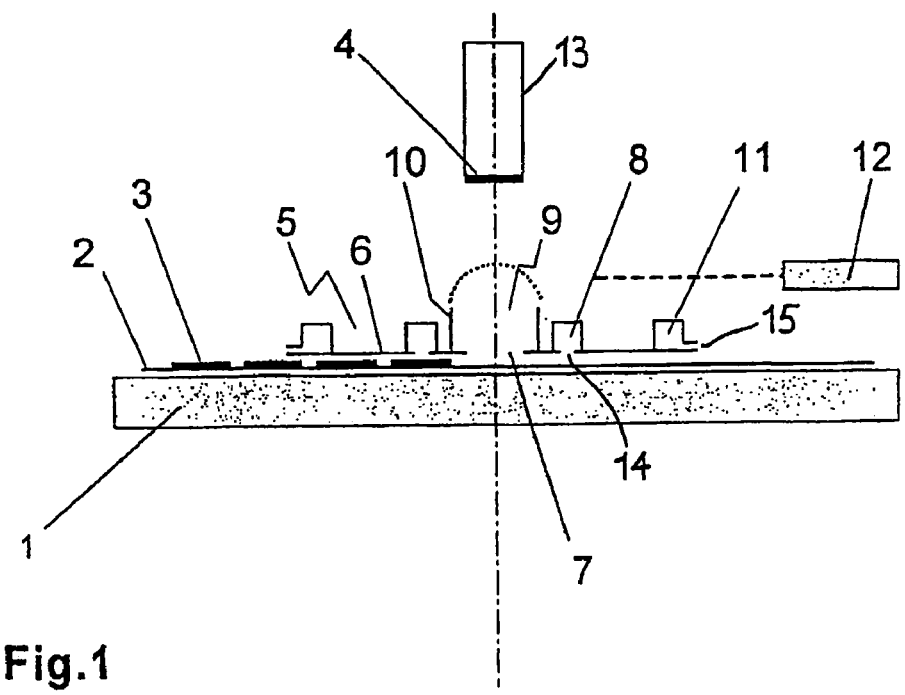
FIG. 1 shows a diagram of an example of the device according to the invention in cross section.

In FIG. 1, the device is represented in cross section. Shown in this example is an automatic placement machine with a clamping device 1, usually referred to as a chuck, which is provided on a transporting area with a transporting device for receiving and transporting a wafer 2, on which the semiconductor chips are to be placed. The wafer is positioned on the chuck with the oxide-free copper surface upwards. Represented in FIG. 1 are chips 3, which have already been soldered on the wafer, and also a further chip 4, which is to be soldered on in the next operation. This chip 4 is brought over the wafer on a chip mount 13 and is held, for example under a suction channel of the chip mount, by a negative pressure induced in the chip mount.

Arranged over the transporting device of the chuck is a flushing device 5, which is essentially formed by a plate 6 with a window 7, a gas channel 8 and a gas outlet opening 14, arranged at the window. This plate is fitted parallel to the transporting area and the wafer arranged there or is fixed in this position at least during the placement operation. The wafer is transported through under the window 7 of this plate, so that the next chip 4 in each case can be placed from above through the window onto the region of the wafer located under the window 7. For this purpose, the chip mount 13 need only be moved in the vertical direction.

The plate 6 is positioned as close as possible above the surface of the wafer. The gas outlet opening 14 is located as close as possible to the window, so that a forming gas supplied through the gas channel 14 directly reaches the region of the wafer on which components are to be placed. In the case of the configuration represented in FIG. 1, the forming gas exits mainly in the window 7 of the plate. The remaining part of the forming gas flows in the radial direction from the outer edge of the plate and prevents ambient air from being sucked in. An oxygen-deficient cloud 9 of forming gas, which is indicated in the drawing by an arcuate dotted line, forms in the region above the window. The formation of this oxygen-deficient zone may be enhanced by an additionally fitted annular diaphragm 10, at the upper edge of which the gas can possibly also be sucked away if need be.

At the edge of the plate 6 there is preferably a further gas channel 11, via which cooling air can be supplied, blowing against the wafer in the outwardly pointing radial direction through the correspondingly arranged further gas outlet opening 15. The further gas outlet opening 15 is formed, for example, by a number of nozzles fitted around the edge of the plate, which are directed outwards, so that the air exits outwards parallel to the surface of the wafer. A radial stream of the cooling gas is to be preferred by far over a direct alignment of the gas stream onto the wafer. With a radial gas stream, the radial flow of the forming gas under the plate 6 is also enhanced.

If the chip 4 to be soldered on is lowered by vertical movement of the chip mount 13 downwards onto the wafer 2, it enters the oxygen-deficient cloud 9. In this position, the chip mount 13 comes into the region where a thermal radiation source 12, which in this exemplary embodiment is formed by a laser radiation source, is coupled in. Consequently, the chip 4 is heated from its rear side facing away from the wafer to such a degree that the solder material on the front side melts and the contact connection in relation to the copper surface of the wafer can thus be established.

It is favourable if the layer of low-melting solder is applied to the contacts of the chip 4 and not to the contacts of the wafer to be soldered to the latter, since better heat contact through the chip to the solder layer is achieved in this way. The heating of the chip in this way leads immediately to the melting of the solder material, which solidifies in a fraction of a second on contact with the colder copper layer of the wafer.

Figure 2:
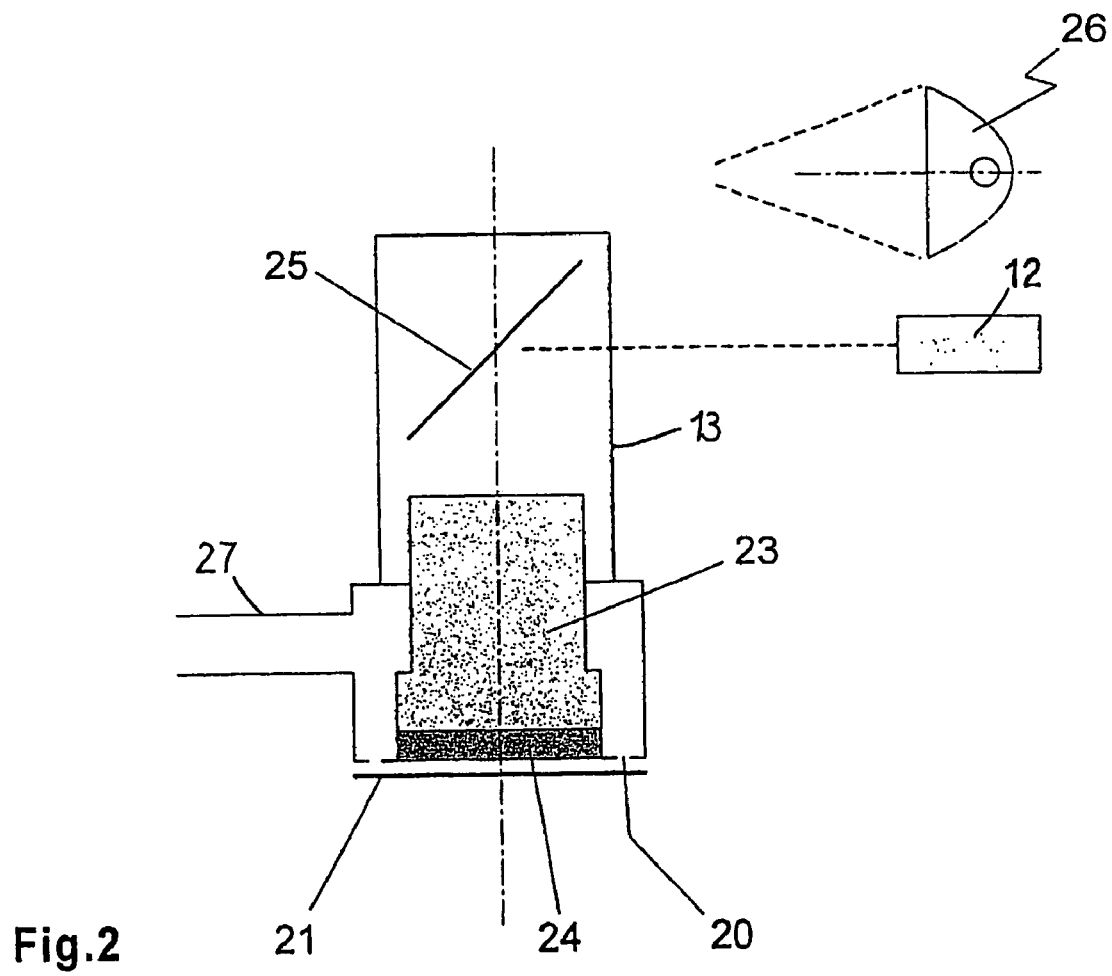
FIG. 2 shows an enlarged representation of the chip mount with the heat sources as a diagram.

In FIG. 2, an exemplary embodiment of the chip mount 13 is shown in cross section. A lower planar area for receiving the chip 21 has openings 20 around the edge, which are connected to a channel. Consequently, the chip 21 is sucked into place. For this purpose, a suction connection piece 27 is connected to a suitable pump or some other device for generating a negative pressure. Fitted within the chip mount is a body 23 which is permeable to infrared radiation. Through this body, the thermal radiation can reach the rear side of the chip sucked into place. The body 23, which may be made of quartz glass for example, is also suitable for transferring the mechanical pressing pressure of typically 3.5 bar to the chip. To transfer the force as uniformly as possible to the chip, there may be provided an additional, likewise infrared-permeable, preferably elastic and temperature-resistant layer 24, which may be silicon for example. The coupling-in of the thermal radiation takes place in this example via the metallic mirror 25, fitted obliquely in the chip mount 13, or via a metallically mirrored prism, which reflects the thermal radiation towards the chip. Such a prism may also be integrated into the body 23.

The homogeneity of the temperature distribution over the chip area is not critical in principle. It just has to be ensured that the melting temperature of the solder material is exceeded everywhere on the contacts. In the interests of a short heating-up time, it is aimed for the chip area to be irradiated with the thermal radiation as uniformly as possible.

On the other hand, the maximum permissible temperature is limited only by the materials used. In principle, it is therefore adequate if only a point, which preferably lies in the centre of the chip, is heated. It is then expedient to wait a moment before the warm chip is brought into contact with the cold wafer. This avoids the solder material from being cooled prematurely before the heat has been able to spread laterally to an adequate extent.

If the heat is not to be irradiated onto only one point, it is possible by a diffuser or a suitable optical system to achieve the effect that the thermal radiation, for example the laser beam, is expanded in a suitable way such that the entire chip area is covered by it. Alternatively, the thermal radiation may be coupled into a light guide, which is coupled onto the chip mount 13 and guides the thermal radiation onto the chip. Such a light guide may replace the mirror 25 or the prism and the body 23. A halogen lamp 26 with a parabolic mirror may also be used instead of the laser radiation source 12 as a heat source. This is shown in FIG. 2 by an alternative drawing.

In the case of particularly small chips with only a few $mm^2$ of surface area, the chip mount, then designed to be correspondingly small, may be subjected to radiation from outside and heated in its entirety. it is also possible for an at least partially metallically formed chip mount to be heated up by means of a heating coil, with which an eddy current is inductively generated in the metal, or else for the solder layer to be directly heated, in that the eddy currents are induced directly in the solder layer.

The lower area of the chip mount, intended for receiving a chip, may consist of a material which has adequate elasticity to permit lateral movements of the chip in the range of typically +/−10 μm. Consequently, a self-centring of the two contact areas structured in mirror-image patterns in relation to one another is achieved on account of the surface tension of the melted solder layer.

What is claimed is:

1. A device for soldering contacts on vertically integrated semiconductor chips, comprising:
    a clamping device that receives and transports a wafer having components;
    a flushing device including a plate with a window, a first gas channel and a first gas outlet opening arranged at the window, the flushing device being aligned parallel to a transporting area of the clamping device intended for the wafer to be held in position above the clamping device;

a chip mount arranged above the clamping device over the window such that a chip can be held on a side of the chip mount facing the clamping device and over the wafer, and the chip can be brought near the wafer by means of a vertical movement of the chip mount with respect to the wafer; and a heater that heats a chip held on the chip mount from a side of the chip facing the chip mount at least to a degree that a solder applied to an opposite side of the chip is melted, wherein an edge of the plate is provided with a second gas channel disposed at an edge of the plate and a second gas outlet opening for the second gas channel, which points towards the edge of the plate adapted to expel a gas parallel to the clamping device.

2. The device according to claim 1, wherein the first gas outlet opening is provided around the window.

3. The device according to claim 1, wherein the heater comprises a thermal radiation source, which is arranged in such a way that thermal radiation emitted by the thermal radiation source is directed through the chip mount onto the chip.

4. The device according to claim 1, wherein the heater comprises an induction coil having electrical terminals and is fitted in the chip mount.

5. The device according to claim 3, further comprising a body which is permeable to infrared radiation and with which a pressing pressure is transferred to the chip is fitted in the chip mount.

6. The device according to claim 4, further comprising an electrically conducting body fitted in the chip mount and arranged in such a way that the electrically conducting body can be heated by an induction of eddy currents by means of the induction coil.

7. The device according to claim 4, wherein the induction coil is arranged such that the induction coil induces eddy currents in the solder applied to the chip held on the chip mount, with which currents the solder is melted.

8. A device for soldering contacts on vertically integrated semiconductor chips, comprising:

a clamping device that receives and transports a wafer having components;

a flushing device including a plate with a window, a first gas channel and a first gas outlet opening arranged at the window, the flushing device being aligned parallel to a transporting area of the clamping device intended for the wafer to be held in position above the clamping device;

a chip mount arranged above the clamping device over the window such that a chip can be held on a side of the chip mount facing the clamping device and over the wafer, and the chip can be brought near the wafer by means of a vertical movement of the chip mount with respect to the wafer, the chip mount comprising a lower planar area for receiving the chip, the planar area having openings around its edge connected to a channel; and a heater that heats a chip held on the chip mount from a side of the chip facing the chip mount at least to a degree that a solder applied to an opposite side of the chip is melted.

9. The device for soldering contacts on vertically integrated semiconductor chips according to claim 8, wherein within the chip mount is a body which is permeable to infrared radiation and is provided for transferring mechanical pressure to press the chip onto the wafer.

10. The device for soldering contacts on vertically integrated semiconductor chips according to claim 8, further comprises a metallic mirror fitted obliquely in the chip mount, the mirror reflecting the thermal radiation towards the chip.

11. The device for soldering contacts on vertically integrated semiconductor chips according to claim 8, further comprises a metallically mirrored prism fitted obliquely in the chip mount, the prism reflecting the thermal radiation towards the chip.

12. The device for soldering contacts on vertically integrated semiconductor chips according to claim 8, wherein the heater comprises an induction coil having electrical terminals and is fitted in the chip mount; and an electrically conducting body fitted in the chip mount and arranged in such a way that the electrically conducting body can be heated by an induction of eddy currents by means of the induction coil.

* * * * *

UNITED STATES PATENT AND TRADEMARK OFFICE
CERTIFICATE OF CORRECTION

PATENT NO.         : 7,389,903 B2                                Page 1 of 1
APPLICATION NO.    : 10/812830
DATED              : June 24, 2008
INVENTOR(S)        : Robert Bergmann et al.

It is certified that error appears in the above-identified patent and that said Letters Patent is hereby corrected as shown below:

On the Title Page, item (75) Inventors: delete "Regensberg" and substitute therefor --Regensburg--.

Signed and Sealed this

Second Day of September, 2008

JON W. DUDAS
*Director of the United States Patent and Trademark Office*